United States Patent
Qiu (10) Patent No.: US 12,046,313 B2
(45) Date of Patent: Jul. 23, 2024

(54) OTP DEVICE WITH READ MODULE AND BIASING CIRCUITRY TO DETECT AND MEASURE ACCURATE BREAKDOWN STATES OF ANTI-FUSE MEMORY CELLS

(71) Applicant: CHANGXIN MEMORY TECHNOLOGIES, INC., Hefei (CN)

(72) Inventor: Anping Qiu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 142 days.

(21) Appl. No.: 17/835,917

(22) Filed: Jun. 8, 2022

(65) Prior Publication Data
US 2023/0230647 A1 Jul. 20, 2023

Related U.S. Application Data

(63) Continuation of application No. PCT/CN2022/076735, filed on Feb. 18, 2022.

(30) Foreign Application Priority Data

Jan. 17, 2022 (CN) .......................... 202210048500.7

(51) Int. Cl.
G11C 17/00 (2006.01)
G11C 17/16 (2006.01)
G11C 17/18 (2006.01)

(52) U.S. Cl.
CPC .............. *G11C 17/18* (2013.01); *G11C 17/16* (2013.01)

(58) Field of Classification Search
CPC .............. G11C 11/4091; G11C 17/165; G11C 13/0011; G11C 29/787
See application file for complete search history.

(56) References Cited

U.S. PATENT DOCUMENTS

| 11,626,177 B1* | 4/2023 | Chang .................... G11C 17/18 365/225.7 |
| 2007/0053236 A1* | 3/2007 | Vogelsang ....... G11C 29/50008 365/96 |
| 2015/0255169 A1* | 9/2015 | Sakamoto ............ G11C 29/789 327/525 |
| 2015/0287475 A1* | 10/2015 | Kim ........................ G11C 29/78 365/96 |

(Continued)

FOREIGN PATENT DOCUMENTS

CN 2513117 Y 9/2002

*Primary Examiner* — Mushfique Siddique
(74) *Attorney, Agent, or Firm* — Kilpatrick Townsend & Stockton LLP (57) ABSTRACT

An anti-fuse memory: an inverting input terminal of an operational amplifier is connected to a feedback terminal of a bias voltage generation module. A voltage across a second input terminal may be obtained according to a voltage across the feedback terminal. The second input terminal is electrically connected to an output terminal of the operational amplifier. The voltage across the second input terminal serves as a bias voltage across a read module. A circuit between a second power supply terminal and the feedback terminal is equivalent to a circuit between a monitoring terminal and a first power supply terminal, and a circuit between the feedback terminal and an adjustable resistor is equivalent to a circuit between the monitoring terminal and an anti-fuse memory cell.

17 Claims, 6 Drawing Sheets

(56) References Cited

U.S. PATENT DOCUMENTS

| | | | |
|---|---|---|---|
| 2019/0311773 A1* | 10/2019 | Jimenez-Olivares | ........................ G11C 5/147 |
| 2022/0283601 A1* | 9/2022 | Kundu | .................... G05F 3/242 |
| 2023/0186973 A1* | 6/2023 | Chen | .................... G11C 17/165 365/205 |

* cited by examiner

OTP DEVICE WITH READ MODULE AND BIASING CIRCUITRY TO DETECT AND MEASURE ACCURATE BREAKDOWN STATES OF ANTI-FUSE MEMORY CELLS

CROSS-REFERENCE TO RELATED APPLICATION

The present disclosure is a continuation of PCT/CN2022/076735, filed on Feb. 18, 2022, which claims priority to Chinese Patent Application No. 202210048500.7 titled "ANTI-FUSE MEMORY" and filed to the State Patent Intellectual Property Office on Jan. 17, 2022, the entire contents of which are incorporated herein by reference.

TECHNICAL FIELD

The present disclosure relates to the field of semiconductor technology, and more particularly, to an anti-fuse memory.

BACKGROUND

As a one-time programmable (OTP) device, an anti-fuse memory may be programmed to store data.

The anti-fuse memory includes anti-fuse memory cells. Before the anti-fuse memory cells are not broken down, they present a high-resistance state. After the anti-fuse memory cells are broken down, they present a low-resistance state. Therefore, it may be determined whether the anti-fuse memory cells are broken down by detecting resistance values of the anti-fuse memory cells by means of a read module.

However, when the read module detects the resistance values of the anti-fuse memory cells, a relatively accurate bias voltage is required to accurately measure breakdown states of the anti-fuse memory cells.

SUMMARY

An embodiment of the present disclosure provides an anti-fuse memory, including:
  an anti-fuse memory array including a plurality of anti-fuse memory cells;
  a read module including a first power supply terminal, a first input terminal, and a monitoring terminal, the first power supply terminal being configured to receive a power supply voltage, the first input terminal being configured to receive a bias voltage, the monitoring terminal being connected to an input terminal of the anti-fuse memory array, the read module being configured to output a level signal according to a voltage across the monitoring terminal to represent breakdown states of the plurality of anti-fuse memory cells, and the level signal having an inverse voltage;
  a bias voltage generation module including a second power supply terminal, a second input terminal, and a feedback terminal, the bias voltage generation module being internally provided with an adjustable resistor configured to simulate a breakdown critical resistance value for the plurality of anti-fuse memory cells, a circuit between the second power supply terminal and the feedback terminal being equivalent to a circuit between the monitoring terminal and the first power supply terminal, and a circuit between the feedback terminal and the adjustable resistor being equivalent to a circuit between the monitoring terminal and the plurality of anti-fuse memory cells; and
  an operational amplifier, a forward input terminal of the operational amplifier being configured to receive a reference voltage equal to the inverse voltage, an inverting input terminal of the operational amplifier being connected to the feedback terminal, an output terminal of the operational amplifier being connected to the second input terminal, and a voltage across the output terminal of the operational amplifier serving as the bias voltage.

BRIEF DESCRIPTION OF THE DRAWINGS

To describe the technical solutions of the present disclosure or those of the prior art more clearly, the accompanying drawings required for describing the embodiments or the prior art will be briefly introduced below. Apparently, the accompanying drawings in the following description are merely some embodiments of the present disclosure. To those of ordinary skills in the art, other accompanying drawings may also be derived from these accompanying drawings without creative efforts.

Some embodiments of the present disclosure have been shown by the above drawings, and more detailed description will be made hereinafter. These drawings and text description are not intended for limiting the scope of conceiving the present disclosure in any way, but for illustrating the concept of the present disclosure for those skilled in the art by referring to some embodiments.

DETAILED DESCRIPTION

Reference will now be made in detail to exemplary embodiments, examples of which are illustrated in the accompanying drawings. When the accompanying drawings are mentioned in the following descriptions, the same numbers in different drawings represent the same or similar elements, unless otherwise represented. The implementations set forth in the following exemplary embodiments do not represent all implementations consistent with the present disclosure. Instead, they are merely examples of apparatuses and methods consistent with some aspects related to the present disclosure as recited in the appended claims.

Other embodiments of the present disclosure will be apparent to those skilled in the art from consideration of the specification and practice of the invention disclosed here. The present disclosure is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the following claims.

Figure 1:
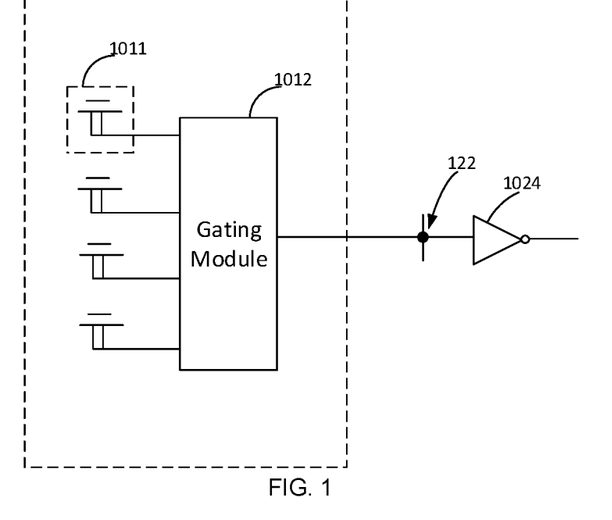
FIG. 1 is a circuit diagram of an anti-fuse memory array according to an embodiment of the present disclosure.
Figure 2:
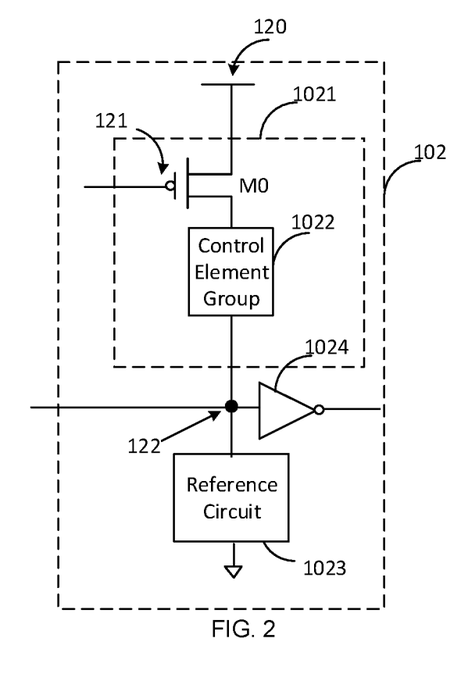
FIG. 2 is a circuit diagram of a read module according to an embodiment of the present disclosure.
Figure 3:
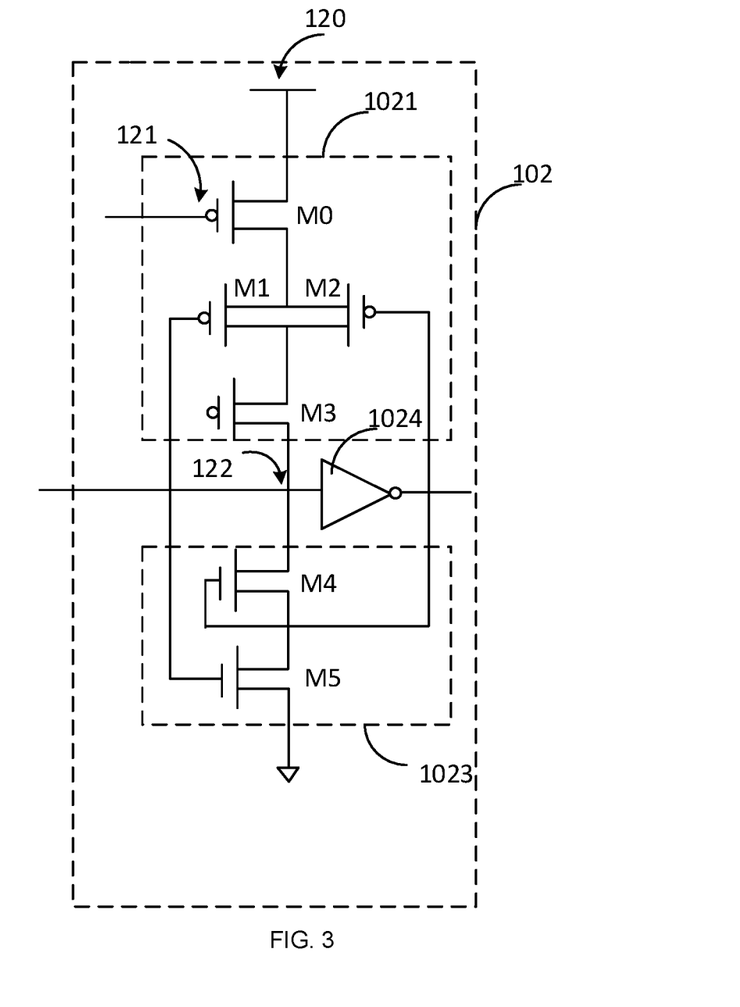
FIG. 3 is a circuit diagram of another read module according to an embodiment of the present disclosure.
Figure 4:
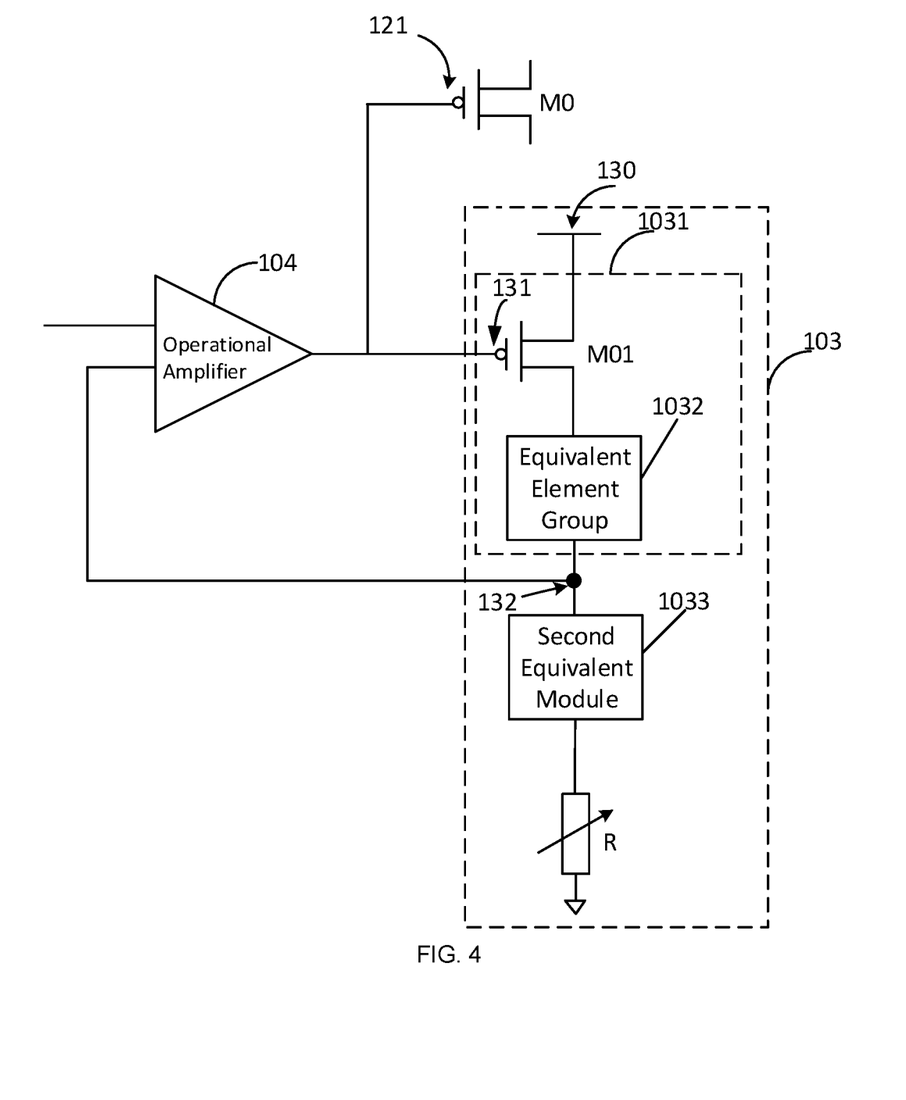
FIG. 4 is a circuit diagram of a bias voltage generation module according to an embodiment of the present disclosure.

FIG. 1 is a circuit diagram of an anti-fuse memory array according to an embodiment of the present disclosure; FIG. 2 is a circuit diagram of a read module according to an embodiment of the present disclosure; FIG. 3 is a circuit diagram of another read module according to an embodiment of the present disclosure; and FIG. 4 is a circuit diagram of a bias voltage generation module according to an embodiment of the present disclosure. As shown in FIGS. 1-4, an anti-fuse memory provided by an embodiment of the present disclosure includes:

- an anti-fuse memory array 101, which includes a plurality of anti-fuse memory cells 1011;
- a read module 102 including a first power supply terminal 120, a first input terminal 121, and a monitoring terminal 122, wherein the first power supply terminal 120 is configured to receive a power supply voltage, the first input terminal 121 is configured to receive a bias voltage, the monitoring terminal 122 is connected to an input terminal of the anti-fuse memory array 101, the read module 102 is configured to output a level signal according to a voltage across the monitoring terminal 122 to represent breakdown states of the plurality of anti-fuse memory cells 1011, and the level signal has an inverse voltage;
- a bias voltage generation module 103 including a second power supply terminal 130, a second input terminal 131, and a feedback terminal 132, the bias voltage generation module 103 being internally provided with an adjustable resistor R configured to simulate a breakdown critical resistance value for the plurality of anti-fuse memory cells 1011, a circuit between the second power supply terminal 130 and the feedback terminal 132 being equivalent to an equivalent circuit between the monitoring terminal 122 and the first power supply terminal 120, and a circuit between the feedback terminal 132 and the adjustable resistor R being equivalent to a circuit between the monitoring terminal 122 and the plurality of anti-fuse memory cells 1011; and
- an operational amplifier 104, a forward input terminal of the operational amplifier 104 being configured to receive a reference voltage equal to the inverse voltage, an inverting input terminal of the operational amplifier 104 being connected to the feedback terminal 132, an output terminal of the operational amplifier 104 being connected to the second input terminal 131, and a voltage across the output terminal of the operational amplifier 104 serving as the bias voltage.

Referring to FIG. 1, the anti-fuse memory array 101 includes a plurality of anti-fuse memory cells 1011, which may be transistors. These transistors present a low-resistance state after they are broken down and present a high-resistance state before they are broken down.

Referring to FIG. 2, the read module 102 includes the first power supply terminal 120, the first input terminal 121, and the monitoring terminal 122. The monitoring terminal 122 is connected to an input terminal of the anti-fuse memory array 101, and the circuit between the second power supply terminal 130 and the feedback terminal 132 is equivalent to the circuit between the first power supply terminal 120 and the monitoring terminal 122, and the circuit between the feedback terminal 132 and the adjustable resistor R is equivalent to the circuit between the monitoring terminal 122 and the plurality of anti-fuse memory cells 1011. After the read module 102 receives the bias voltage, when a breakdown critical resistance value of the plurality of anti-fuse memory cells 1011 is equal to an adjustable resistance value, the monitoring terminal 122 has a critical voltage equal to the inverse voltage. In an actual situation, when a given one of the plurality of anti-fuse memory cells 1011 in the anti-fuse memory array 101 is effectively broken down, an actual breakdown resistance value is less than the critical value. In this case, the voltage across the monitoring terminal 122 is pulled down, and the voltage across the monitoring terminal 122 actually is smaller than the inverse voltage. When the given anti-fuse memory cell 1011 in the anti-fuse memory array 101 is not effectively broken down, the actual breakdown resistance value is greater than the critical value. In this case, the voltage across the monitoring terminal 122 is pulled up, and the voltage across the monitoring terminal 122 actually is greater than the inverse voltage. Thus, a relationship between the voltage across the monitoring terminal 122 and the inverse voltage may be determined according to a level signal outputted by the read module 102, and then it is determined whether the given anti-fuse memory cell 1011 is effectively broken down.

In some embodiments, the read module 102 includes an inverter 1024, wherein an input terminal of the inverter 1024 is connected to the input terminal of the monitoring terminal 122 and the input terminal of the anti-fuse storage array 101. After the read module 102 receives the bias voltage and the power supply voltage, when the breakdown resistance of the given anti-fuse memory cell 1011 is in a critical state, the input terminal of the inverter 1024 has a critical voltage equal to the inverse voltage. When the given anti-fuse memory cell 1011 in the anti-fuse memory array 101 is effectively broken down, the actual breakdown resistance value of the given anti-fuse memory cell 1011 is less than the breakdown resistance value in the critical state, such that the voltage across the input terminal of the inverter 1024 is pulled down, and the inverter 1024 outputs a level signal 1, which represents that the given anti-fuse memory cell 1011 is effectively broken down. When the given anti-fuse memory cell 1011 in the anti-fuse memory array 101 is not effectively broken down, the actual breakdown resistance value of the given anti-fuse memory cell 1011 is greater than the breakdown resistance value in the critical state, such that the voltage across the input terminal of the inverter 1024 is pulled up, and the inverter 1024 outputs a level signal of 0, which represents that the given anti-fuse memory cell 1011 is not broken down.

In some embodiments, referring to FIG. 2, the read module 102 includes a first control module 1021 connected in series between the first power supply terminal 120 and the monitoring terminal 122. The first control module 1021 includes a first control transistor M0. A drain of the first control transistor M0 is electrically connected to the first power supply terminal 120, a source of the first control transistor M0 is electrically connected to the monitoring terminal 122, and a gate of the first control transistor M0 is used as the first input terminal 121 of the read module 102. The first input terminal 121 is configured to receive the bias voltage. That is, the gate of the first control transistor M0 is configured to receive the bias voltage, such that the first control transistor M0 is enabled under the action of the bias voltage.

The first control module 1021 may include a control element group 1022 connected in series between the first control transistor M0 and the monitoring terminal 122. The control element group 1022 may include a plurality of transistors. As shown in FIG. 2 and FIG. 3, the control element group 1022 may include, for example, a second control transistor M1, a third control transistor M2, and a fourth control transistor M3. The first control transistor M0, the second control transistor M0, the third control transistor M2 and the fourth control transistor M3 may all be P-type transistors.

In some embodiments, a drain of the second control transistor M1 and a drain of the third control transistor M2 are electrically connected to the source of the first control transistor M0, a source of the second control transistor M1 and a source of the third control transistor M2 are electrically connected to a drain of the fourth control transistor M3, and a source of the fourth control transistor M3 is electrically connected to the monitoring terminal 122. It is to be understood that after the first control transistor M0 is enabled under the action of the bias voltage, it is required to control the second control transistor M1, the third control transistor M2 and the fourth control transistor M3 to be enabled simultaneously, such that when the breakdown critical resistance value of the given anti-fuse memory cell 1011 is equal to the adjustable resistance value, the monitoring terminal 122 has the critical voltage equal to the inverse voltage.

The read module 102 may also include a reference circuit 1023, wherein one end of the reference circuit 1023 is connected to the monitoring terminal 122, and the reference circuit 1023 is equivalent to the circuit between the monitoring terminal 122 and the plurality of anti-fuse memory cells 1011. The bias voltage across the read module 102 can be accurately obtained by copying the read module 102 and providing the adjustable resistor on the basis of the read module 102, which is advantageous to reducing design difficulty of the bias voltage generation module 103. In addition, the resistance value of the adjustable resistor R may be adjusted to zero. When none of the plurality of anti-fuse memory cells 1011 is fused, it may be verified whether the bias voltage generation module 103 and the operational amplifier 104 operate according to preset conditions by means of the read module 102. That is, it is verified whether the voltage across the monitoring terminal 122 is equal to the reference voltage, whose voltage value is equal to the inverse voltage, received by the forward input terminal of the operational amplifier 104.

The reference circuit 1023 may include a plurality of transistors, for example, a fifth transistor M4 and a sixth transistor M5. A drain of the fifth control transistor M4 is connected to the monitoring terminal 122, a source of the fifth control transistor M4 is connected to a drain of the sixth control transistor M5, and a source of the sixth control transistor M5 may be electrically connected to a third power supply terminal or may be grounded, wherein a voltage across the third power supply terminal is smaller than the voltage across the first power supply terminal 120. The fifth control transistor M4 and the sixth control transistor M5 may be N-type transistors. In this case, when the second control transistor M1 and the third control transistor M2 are P-type transistors, a gate terminal of the fifth control transistor M4 may be electrically connected to a gate terminal of the third control transistor M2, and a gate terminal of the sixth control transistor M5 may be electrically connected to a gate terminal of the second control transistor M1. Thus, when the second control transistor M1 and the third control transistor M2 are enabled, the fifth control transistor M4 and the sixth control transistor M5 are disabled; and when the fifth control transistor M4 and the sixth control transistor M5 are enabled, the second control transistor M1 and the third control transistor M2 are disabled. It is found that the read module 102 needs a relatively accurate bias voltage to detect the breakdown state of the given anti-fuse memory cell 1011, so the bias voltage generation module 103 is provided. Referring to FIG. 4, the bias voltage generation module 103 includes the second power supply terminal 130, the second input terminal 131, and the feedback terminal 132. The bias voltage generation module 103 is internally provided with an adjustable resistor R configured to simulate a breakdown critical resistance value for the given anti-fuse memory cell 1011. Different anti-fuse memory cells like have different characteristics, so providing the adjustable resistor R is advantageous to ensuring a timely adjustment and ensuring an equivalent relationship when testing different anti-fuse memory cells 1011. The circuit between the second power supply terminal 130 and the feedback terminal 132 of the bias voltage generation module 103 is equivalent to the equivalent module between the monitoring terminal 122 and the first power supply terminal 120, and the circuit between the feedback terminal 132 and the adjustable resistor R is equivalent to the circuit between the monitoring terminal 122 and the plurality of anti-fuse memory cells 1011. Thus, the bias voltage generation module 103 is equivalent to a part of circuits in the read module 102 and a part of circuits in the anti-fuse storage array 101, to generate an accurate bias voltage.

Figure 5:
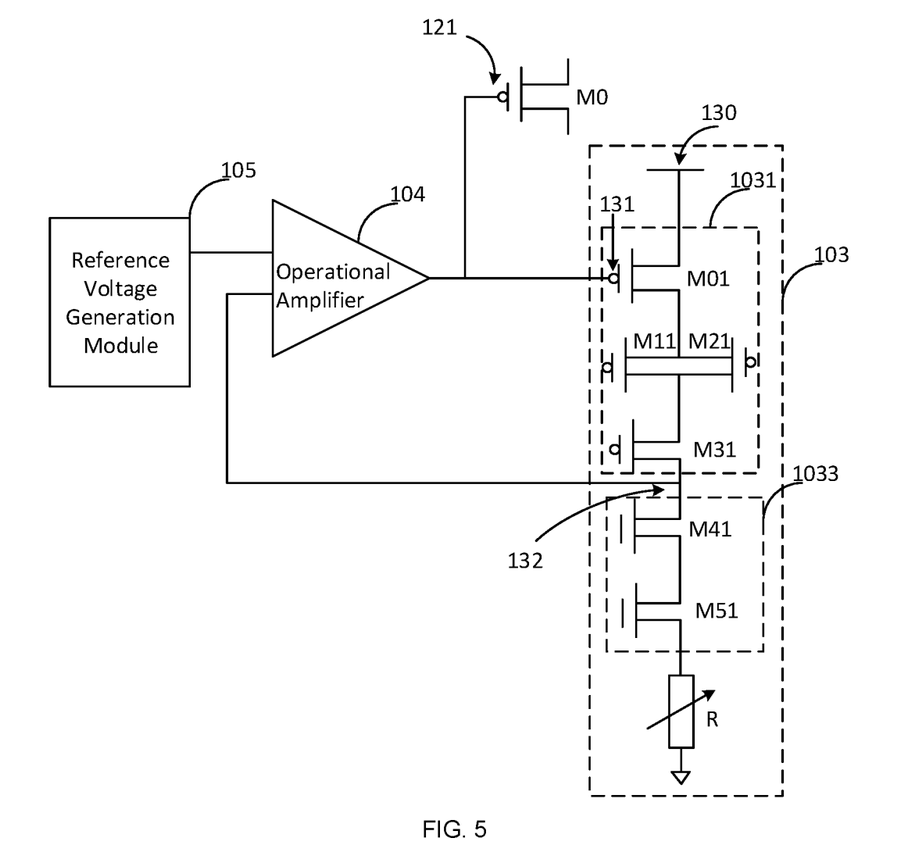
FIG. 5 is a circuit diagram of another bias voltage generation module according to an embodiment of the present disclosure.

Referring to FIG. 4, the feedback terminal 132 of the bias voltage generation module 103 is connected to the inverting input terminal of the operational amplifier 104, and the forward input terminal of the operational amplifier 104 is configured to receive the reference voltage equal to the inverse voltage in the level signal outputted by the read module 102. When the operational amplifier 104 has a larger gain, it may be approximately considered that the forward input terminal and the inverting input terminal of the operational amplifier 104 have the equal voltage. That is, after the forward input terminal of the operational amplifier 104 receives the reference voltage equal to the inverse voltage, the voltage across the inverting input terminal of the operational amplifier 104 is also the reference voltage, and the voltage across the feedback terminal 132 is also the reference voltage. Next, a bias current of the bias voltage generation module 103 is obtained according to the voltage across the feedback terminal 132 and a resistance value of the adjustable resistor R connected to the feedback terminal 132, and a voltage across the second input terminal 131 is obtained according to the bias current, a resistance of an element between the second input terminal 131 and the adjustable resistor R, and the resistance value of the adjustable resistor R. The output terminal of the operational amplifier 104 is connected to the second input terminal 131, so the voltage across the output terminal may be obtained, and the voltage across the output terminal is used as the bias voltage. The forward input terminal of the operational amplifier 104 may also be connected to a reference voltage generation module 105. Referring to FIG. 5, the reference voltage generation module 105 is configured to generate the reference voltage equal to the inverse voltage.

In some embodiments, as shown in FIG. 5, the bias voltage generation module 103 includes a first equivalent module 1031 connected in series between the second power supply terminal 130 and the feedback terminal 132. The first equivalent module 1031 is equivalent to the circuit between the first power supply terminal 120 and the monitoring terminal 122 in the read module 102. That is, the first equivalent module 1031 is equivalent to the first control module 1021. The first equivalent module 1031 includes a first equivalent transistor M01 equivalent to the first control transistor M0. A drain of the first equivalent transistor M01 is electrically connected to the second power supply terminal 130, a source of the first equivalent transistor M01 is electrically connected to the feedback terminal 132, and a gate of the first equivalent transistor M01 is used as the second input terminal 131. After the bias current of the bias voltage generation module 103 is obtained, a source voltage across the first equivalent transistor M01 may be obtained according to the resistance value of an element between the first equivalent transistor M01 and the adjustable resistor R, and the resistance value of the adjustable resistor R. Next, a gate voltage across the first equivalent transistor M01 is obtained according to a break-over voltage and the source voltage across the first equivalent transistor M01, wherein the gate voltage is the voltage across the second input terminal 131, that is, the voltage across the output terminal of the operational amplifier, i.e., the bias voltage.

Figure 6:
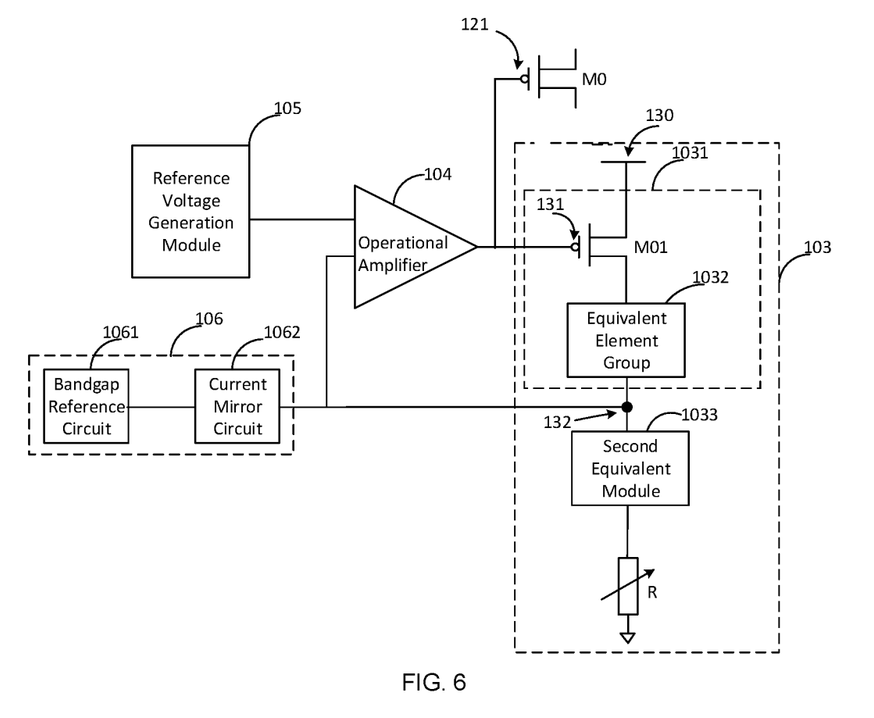
FIG. 6 is a circuit diagram of yet another bias voltage generation module according to an embodiment of the present disclosure.

Referring to FIG. 5 and FIG. 6, the first equivalent module 1031 may include an equivalent element group 1032 connected in series between the first equivalent transistor M01 and the feedback terminal 132. The equivalent element group 1032 is equivalent to a circuit element between the first control transistor M0 and the monitoring terminal 122. That is, the equivalent element group 1032 is equivalent to the control element group 1022. The equivalent element group 1032 includes other elements, which may be equivalent to, for example, resistors of the transistors in the read module 102, wherein the resistors are configured to be equivalent to source-drain voltage drop of the transistors in the read module 102. The equivalent element group 1032 may include a plurality of transistors. For example, the equivalent element group 1032 may include a second equivalent transistor M11, a third equivalent transistor M21, and a fourth equivalent transistor M31. In this case, the second equivalent transistor M11 is equivalent to the second control transistor M1, the third equivalent transistor M21 is equivalent to the third control transistor M2, and the fourth equivalent transistor M31 is equivalent to the fourth equivalent transistor M3. A drain of the second equivalent transistor M11 and a drain of the third equivalent transistor M21 are electrically connected to the source of the first equivalent transistor M01, a source of the second equivalent transistor M11 and a source of the third equivalent transistor M21 are electrically connected to a drain of the fourth equivalent transistor M31, and a source of the fourth equivalent transistor M31 is electrically connected to the feedback terminal 132.

The bias voltage generation module 103 may also include a second equivalent module 1033 connected in series between the feedback terminal 132 and the adjustable resistor R, and the second equivalent module 1033 is equivalent to the reference circuit 1023 in a read circuit 101. In some embodiments, the second equivalent module 1033 may include a fifth equivalent transistor M41 and a sixth equivalent transistor M51. In this case, the fifth equivalent transistor M41 is equivalent to the fifth control transistor M4, and the sixth equivalent transistor M51 is equivalent to the sixth control transistor M5. A drain of the fifth equivalent transistor M41 is electrically connected to the feedback terminal 132, a source of the fifth equivalent transistor M41 is electrically connected to a source of the sixth equivalent transistor M51, and a drain of the sixth equivalent transistor MM is electrically connected to the adjustable resistor R.

The circuit between the second power supply terminal 130 and the feedback terminal 132 of the bias voltage generation module 103 is equivalent to the circuit between the monitoring terminal 122 and the first power supply terminal 120, the circuit between the feedback terminal 132 and the adjustable resistor R is equivalent to the circuit between the monitoring terminal 122 and the plurality of anti-fuse memory cells 1011, and the adjustable resistor R can simulate the breakdown critical resistance value for the given anti-fuse memory cell, and the voltage across the feedback terminal 132 is the reference voltage equal to the inverse voltage. Therefore, an accurate bias voltage can be generated.

It is found that the adjustable resistor has temperature characteristics, such that the adjustable resistor has different resistance values at different temperatures, resulting in a fact that the bias voltages generated at different temperatures may be different, which may have a negative effect on accuracy of detecting the breakdown state of the given anti-fuse memory cell. For example, when a high temperature test is performed, the bias current Ires is represent by I1, the generated bias voltage is represent by vfsread1, and a breakdown resistance value range simulated by the adjustable resistor R for the given anti-fuse memory cell is represent by R1. Because of its temperature characteristics, the resistance value of the adjustable resistor R becomes smaller when a low temperature test is performed, the bias current is represent by I2 and I2>I1, the generated bias voltage is represent by vfsread2 and vfsread2 is less than vfsread1, the breakdown resistance value range simulated by the adjustable resistor R for the given anti-fuse memory cell is represent by R2, and R2>R1. In this case, it may likely cause a fact that the given anti-fuse memory cell whose resistance value is greater than R1 is mistaken to be broken down. Therefore, a compensation circuit 106 is additionally provided, as shown in FIG. 6. The compensation circuit 106 is configured to compensate for variation of the resistance value of the adjustable resistor caused by temperature, such that the bias voltage generation module 103 can generate a stable bias voltage.

The compensation circuit 106 is electrically connected to the feedback terminal 132 of the bias voltage generation module 103 to provide a compensation current Icom to the bias voltage generation module 103, such that a new bias voltage may be obtained based on the compensation current Icom and the bias current Ires. When tests are performed at different temperatures, the compensation circuit 106 provides different compensation currents. For example, when the high temperature test is performed, the bias current is I1, and the compensation current added is Icom1, so the total bias current is I1+Icom1. When the low temperature test is performed, the bias current is I2, and the compensation current added is Icom2, so the total bias current is I2+Icom2. Because I1>I2 and Icom1<Icom2, a difference value between I1+Icom1 and I2+Icom2 is smaller, such that a difference between the corresponding bias voltages is smaller, thereby reducing the negative effect of resistor temperatures on the bias voltage.

In some embodiments, the compensation circuit 106 includes a bandgap reference circuit 1061 configured to provide the compensation current, wherein magnitude of the compensation current is directly proportional to an absolute temperature. That is, the bandgap reference circuit 1061 provides a current directly proportional to the absolute temperature (PTAT), to reduce the negative effect of the resistor temperatures on the bias voltage.

The compensation circuit 106 may also include a current mirror circuit 1062 connected in series between the bandgap reference circuit 1061 and the feedback terminal 132 of the bias voltage generation module 103. The current mirror circuit 106 is configured to adjust the compensation current provided by the bandgap reference circuit 1061 to provide a corrected current linearly related to the absolute temperature. Thus, after the bandgap reference circuit 1061 provides the current directly proportional to the absolute temperature, the current is adjusted by the current mirror circuit 1062, such that an appropriate current is provided to the bias voltage generation module 103.

Figure 7:
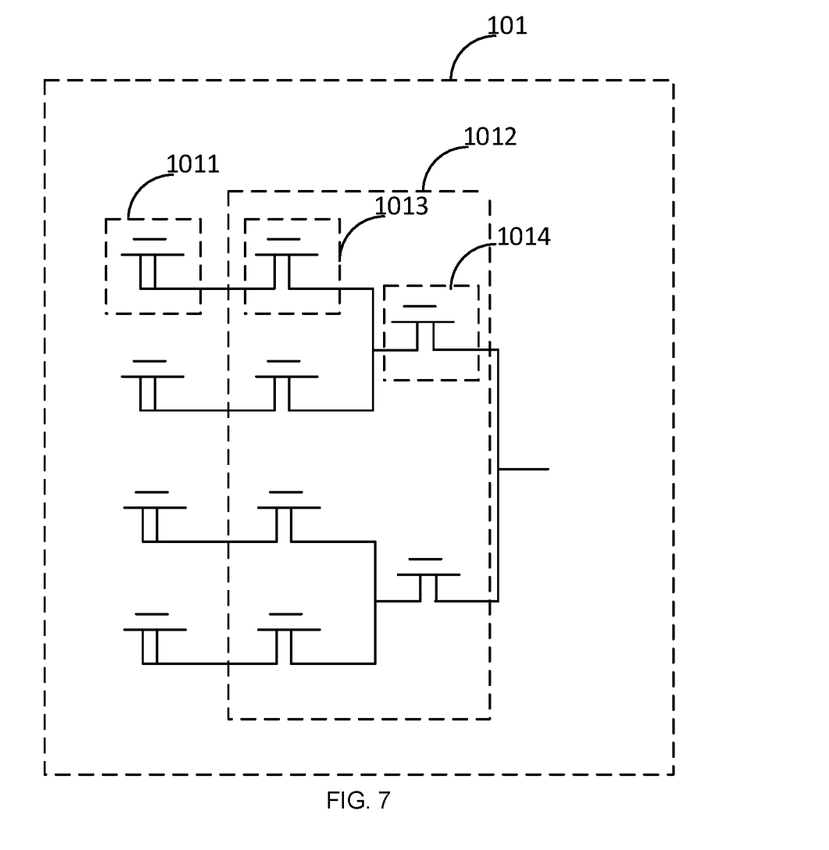
FIG. 7 is a circuit diagram of another anti-fuse memory array according to an embodiment of the present disclosure.

In some embodiments, as shown in FIG. 7, the anti-fuse memory array 101 may also include a gating module 1012. A first terminal of the gating module 1012 is electrically connected to the monitoring terminal 122 of the read module 102, and a second terminal of the gating module 1012 is electrically connected to the plurality of anti-fuse memory cells 1011. The gating module 1012 is configured to control the given anti-fuse memory cell 1011 in a to-be-detected breakdown state to be enabled, and the gating module 1012 is equivalent to the reference circuit 1023 in the read module 102.

In one embodiment, the gating module 1012 may include a plurality of first gating units 1013. A first terminal of each of the plurality of first gating units 1013 is electrically connected to the monitoring terminal 122, a second terminal of each of the plurality of first gating units 1013 is electrically connected to first terminals of a plurality of second gating units 1014, and a second terminal of each of the plurality of second gating units 1014 is electrically connected to one of the plurality of anti-fuse memory cells 1011. In this case, a given one of the plurality of first gating units 1013 and a given one of the plurality of second gating units 1014 can control the anti-fuse memory array 1011 to be enabled, to detect the breakdown state of the anti-fuse memory array 1011. Thus, a given one of the plurality of first gating units 1013 and a given one of the plurality of second gating units 1014 are equivalent to the reference circuit 1023 in the read module 102, the given first gating unit 1013 is equivalent to the fifth control transistor M4, and the given second gating unit 1014 is equivalent to the sixth control transistor M5. That is, the plurality of first gating units 1013 and the plurality of second gating units 1014 may be transistors, such as N-type transistors.

It is to be noted that the present disclosure neither limits number of gating units connected in series between the plurality of anti-fuse memory cells 1011 and the monitoring terminal in the gating module 1012 nor limits types of the gating units. Correspondingly, circuits in the reference circuit 1023 may be adjusted according to the number and the types of the gating units connected in series in the gating module 1012.

In the above technical solutions, the forward input terminal of the operational amplifier is configured to receive the reference voltage equal to the inverse voltage, and the inverting input terminal of the operational amplifier is connected to the feedback terminal of the bias voltage generation module. When the operational amplifier is in a stable state, the voltage across the inverting input terminal is equal to the voltage across the forward input terminal, so the voltage across the feedback terminal is also equal to the reference voltage. Thus, the bias voltage across the bias voltage generation module can be obtained by means of the adjustable resistor and the reference voltage, to obtain the voltage across the output terminal connected to the first input terminal, i.e., the bias voltage. The circuit between the second power supply terminal and the feedback terminal of the bias voltage generation module is equivalent to the circuit between the monitoring terminal and the first power supply terminal, the circuit between the feedback terminal and the adjustable resistor is equivalent to the circuit between the monitoring terminal and the plurality of anti-fuse memory cells, and the adjustable resistor can simulate the breakdown critical resistance value for the plurality of anti-fuse memory cells. Thus, an accurate bias voltage can be obtained. After the bias voltage is inputted to the first input terminal of the read module, the read module is enabled. After the first power supply terminal of the read module receives the power supply voltage, when the breakdown critical resistance value for the plurality of anti-fuse memory cells is equal to the resistance value of the adjustable resistor, the monitoring terminal of the read module has a critical voltage equal to the inverse voltage, and a level signal is outputted based on a monitoring terminal voltage. The state of the level signal can reflect a relationship between the monitoring terminal voltage and the inverse voltage, and then it is determined whether the given anti-fuse memory cell is effectively broken down.

It is to be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims.

What is claimed is:

1. An anti-fuse memory, comprising:
 an anti-fuse memory array comprising a plurality of anti-fuse memory cells;
 a read module comprising a first power supply terminal, a first input terminal, and a monitoring terminal, the first power supply terminal being configured to receive a power supply voltage, the first input terminal being configured to receive a bias voltage, the monitoring terminal being connected to an input terminal of the anti-fuse memory array, the read module being configured to output a level signal according to a voltage across the monitoring terminal to represent breakdown states of the plurality of anti-fuse memory cells, and the level signal having an inverse voltage;
 a bias voltage generation module comprising a second power supply terminal, a second input terminal, and a feedback terminal, the bias voltage generation module being internally provided with an adjustable resistor configured to simulate a breakdown critical resistance value for the plurality of anti-fuse memory cells, a circuit between the second power supply terminal and the feedback terminal being equivalent to a circuit between the monitoring terminal and the first power supply terminal, and a circuit between the feedback terminal and the adjustable resistor being equivalent to a circuit between the monitoring terminal and the plurality of anti-fuse memory cells; and
 an operational amplifier, a forward input terminal of the operational amplifier being configured to receive a reference voltage equal to the inverse voltage, an inverting input terminal of the operational amplifier being connected to the feedback terminal, an output terminal of the operational amplifier being connected to the second input terminal, and a voltage across the output terminal of the operational amplifier serving as the bias voltage; and,
 wherein the bias voltage generation module comprises a first equivalent module connected in series between the second power supply terminal and the feedback terminal, the first equivalent module comprising a first equivalent transistor, a drain of the first equivalent transistor being electrically connected to the second power supply terminal, a source of the first equivalent transistor being electrically connected to the feedback terminal, and a gate of the first equivalent transistor being used as the second input terminal.

2. The anti-fuse memory according to claim 1, wherein the first equivalent module comprises an equivalent element group connected in series between the first equivalent transistor and the feedback terminal.

3. The anti-fuse memory according to claim 2, wherein the equivalent element group comprises a second equivalent transistor, a third equivalent transistor, and a fourth equivalent transistor, a drain of the second equivalent transistor and a drain of the third equivalent transistor being electrically connected to the source of the first equivalent transistor, a source of the second equivalent transistor and a source of the third equivalent transistor being electrically connected to a drain of the fourth equivalent transistor, and a source of the fourth equivalent transistor being electrically connected to the feedback terminal.

4. The anti-fuse memory according to claim 1, wherein the bias voltage generation module comprises a second equivalent module connected in series between the feedback terminal and the adjustable resistor.

5. The anti-fuse memory according to claim 4, wherein the second equivalent module comprises a fifth equivalent transistor and a sixth equivalent transistor, a drain of the fifth equivalent transistor being electrically connected to the feedback terminal, a source of the fifth equivalent transistor being electrically connected to a drain of the sixth equivalent transistor, and a source of the sixth equivalent transistor being electrically connected to the adjustable resistor.

6. The anti-fuse memory according to claim 1, further comprising:
a compensation circuit electrically connected to the feedback terminal of the bias voltage generation module, the compensation circuit being configured to provide a compensation current to the bias voltage generation module.

7. The anti-fuse memory according to claim 6, wherein the compensation circuit comprises a bandgap reference circuit configured to provide the compensation current, magnitude of the compensation current being directly proportional to an absolute temperature.

8. The anti-fuse memory according to claim 7, wherein the compensation circuit further comprises:
a current mirror circuit connected in series between the bandgap reference circuit and the feedback terminal, the current mirror circuit being configured to adjust the compensation current provided by the bandgap reference circuit to provide a corrected current linearly related to the absolute temperature.

9. The anti-fuse memory according to claim 1, wherein the read module further comprises a reference circuit, one end of the reference circuit being connected to the monitoring terminal, and the reference circuit being equivalent to the circuit between the monitoring terminal and the plurality of anti-fuse memory cells.

10. The anti-fuse memory according to claim 9, wherein the reference circuit comprises a fifth control transistor and a sixth control transistor, a drain of the fifth control transistor being electrically connected to the monitoring terminal, and a source of the fifth control transistor being electrically connected to a drain of the sixth control transistor.

11. The anti-fuse memory according to claim 1, wherein the read module comprises a first control module connected in series between the first power supply terminal and the monitoring terminal, the first control module comprising a first control transistor, a drain of the first control transistor being electrically connected to the first power supply terminal, a source of the first control transistor being electrically connected to the monitoring terminal, and a gate of the first control transistor being used as the first input terminal.

12. The anti-fuse memory according to claim 11, wherein the first control module comprises a control element group connected in series between the first control transistor and the monitoring terminal.

13. The anti-fuse memory according to claim 1, wherein the anti-fuse memory array comprises a gating module provided with a first terminal and a second terminal, the first terminal of the gating module being connected to the monitoring terminal, and the second terminal of the gating module being connected to the plurality of anti-fuse memory cells.

14. The anti-fuse memory according to claim 13, wherein the gating module comprises a plurality of first gating units, a first terminal of each of the plurality of first gating units being electrically connected to the monitoring terminal, a second terminal of each of the plurality of first gating units being electrically connected to first terminals of a plurality of second gating units, and the second terminal of each of the plurality of second gating units being electrically connected to one of the plurality of anti-fuse memory cells.

15. An anti-fuse memory, comprising:
an anti-fuse memory array comprising a plurality of anti-fuse memory cells;
a read module comprising a first power supply terminal, a first input terminal, and a monitoring terminal, the first power supply terminal being configured to receive a power supply voltage, the first input terminal being configured to receive a bias voltage, the monitoring terminal being connected to an input terminal of the anti-fuse memory array, the read module being configured to output a level signal according to a voltage across the monitoring terminal to represent breakdown states of the plurality of anti-fuse memory cells, and the level signal having an inverse voltage;
a bias voltage generation module comprising a second power supply terminal, a second input terminal, and a feedback terminal, the bias voltage generation module being internally provided with an adjustable resistor configured to simulate a breakdown critical resistance value for the plurality of anti-fuse memory cells, a circuit between the second power supply terminal and the feedback terminal being equivalent to a circuit between the monitoring terminal and the first power supply terminal, and a circuit between the feedback terminal and the adjustable resistor being equivalent to a circuit between the monitoring terminal and the plurality of anti-fuse memory cells; and
an operational amplifier, a forward input terminal of the operational amplifier being configured to receive a reference voltage equal to the inverse voltage, an inverting input terminal of the operational amplifier being connected to the feedback terminal, an output terminal of the operational amplifier being connected to the second input terminal, and a voltage across the output terminal of the operational amplifier serving as the bias voltage;
wherein the read module comprises a first control module connected in series between the first power supply terminal and the monitoring terminal, the first control module comprising a first control transistor, a drain of the first control transistor being electrically connected to the first power supply terminal, a source of the first control transistor being electrically connected to the monitoring terminal, and a gate of the first control transistor being used as the first input terminal; and, wherein the first control module comprises a control element group connected in series between the first control transistor and the monitoring terminal.

16. The anti-fuse memory according to claim 15, wherein the control element group comprises a second control transistor, a third control transistor, and a fourth control transistor, a drain of the second control transistor and a drain of the third control transistor being electrically connected to the source of the first control transistor, a source of the second control transistor and a source of the third control transistor being electrically connected to a drain of the fourth control transistor, and a source of the fourth control transistor being electrically connected to the monitoring terminal.

17. An anti-fuse memory, comprising:
an anti-fuse memory array comprising a plurality of anti-fuse memory cells;
a read module comprising a first power supply terminal, a first input terminal, and a monitoring terminal, the first power supply terminal being configured to receive a power supply voltage, the first input terminal being configured to receive a bias voltage, the monitoring terminal being connected to an input terminal of the anti-fuse memory array, the read module being configured to output a level signal according to a voltage across the monitoring terminal to represent breakdown states of the plurality of anti-fuse memory cells, and the level signal having an inverse voltage;
a bias voltage generation module comprising a second power supply terminal, a second input terminal, and a feedback terminal, the bias voltage generation module being internally provided with an adjustable resistor configured to simulate a breakdown critical resistance value for the plurality of anti-fuse memory cells, a circuit between the second power supply terminal and the feedback terminal being equivalent to a circuit between the monitoring terminal and the first power supply terminal, and a circuit between the feedback terminal and the adjustable resistor being equivalent to a circuit between the monitoring terminal and the plurality of anti-fuse memory cells; and an operational amplifier, a forward input terminal of the operational amplifier being configured to receive a reference voltage equal to the inverse voltage, an inverting input terminal of the operational amplifier being connected to the feedback terminal, an output terminal of the operational amplifier being connected to the second input terminal, and a voltage across the output terminal of the operational amplifier serving as the bias voltage;

wherein the anti-fuse memory array comprises a gating module provided with a first terminal and a second terminal, the first terminal of the gating module being connected to the monitoring terminal, and the second terminal of the gating module being connected to the plurality of anti-fuse memory cells; and, wherein the gating module comprises a plurality of first gating units, a first terminal of each of the plurality of first gating units being electrically connected to the monitoring terminal, a second terminal of each of the plurality of first gating units being electrically connected to first terminals of a plurality of second gating units, and the second terminal of each of the plurality of second gating units being electrically connected to one of the plurality of anti-fuse memory cells.

* * * * *